(12) United States Patent
Andersson et al.

(10) Patent No.: US 9,509,273 B2
(45) Date of Patent: Nov. 29, 2016

(54) TRANSFORMER FILTER ARRANGEMENT

(75) Inventors: Stefan Andersson, Lund (SE);
Fenghao Mu, Hjärup (SE); Johan Wernehag, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 25 days.

(21) Appl. No.: 14/233,497
(22) PCT Filed: Jun. 28, 2012
(86) PCT No.: PCT/SE2012/050729
§ 371 (c)(1),
(2), (4) Date: Mar. 11, 2014
(87) PCT Pub. No.: WO2013/012373
PCT Pub. Date: Jan. 24, 2013

(65) Prior Publication Data
US 2014/0210571 A1    Jul. 31, 2014

Related U.S. Application Data

(60) Provisional application No. 61/538,250, filed on Sep. 23, 2011.

(30) Foreign Application Priority Data

Jul. 21, 2011 (EP) .................................. 11174822

(51) Int. Cl.
| | | |
|---|---|---|
| H03H 7/09 | (2006.01) |
| H01F 27/42 | (2006.01) |
| H03H 7/01 | (2006.01) |
| H01F 27/29 | (2006.01) |
| H03H 7/38 | (2006.01) |

(Continued)

(52) U.S. Cl.
CPC .............. H03H 7/09 (2013.01); H01F 27/42 (2013.01); H03H 7/1758 (2013.01);
(Continued)

(58) Field of Classification Search
CPC ........ H03H 7/09; H03H 7/38; H03H 7/1758; H03H 7/42; H03H 7/425; H01F 27/42; H01F 27/29; H01F 27/2804
USPC ..................................................... 333/25, 177
See application file for complete search history.

(56) References Cited

U.S. PATENT DOCUMENTS

2,021,734 A    11/1935   Macalpine
4,012,703 A *   3/1977   Chamberlayne ............ 333/24 R
(Continued)

FOREIGN PATENT DOCUMENTS

| DE | 906818 A1 | 3/1954 |
| JP | 2010154517 A | 7/2010 |
| JP | 2010154517 A1 | 7/2010 |

OTHER PUBLICATIONS

Extended European Search Report dated Jan. 11, 2012 for European Regional Patent Application Serial No. 11174822.4-1233, EP Regional Entry Date: Jul. 21, 2011 consisting of 6 pages.

(Continued)

*Primary Examiner* — Benny Lee
*Assistant Examiner* — Albens Dieujuste
(74) *Attorney, Agent, or Firm* — Christopher & Weisberg, P.A.

(57) ABSTRACT

A transformer filter arrangement including a transformer having a first winding and a second winding is provided. Both of the first and the second windings are located between an outer border and an inner border, which is inside the outer border. The transformer filter arrangement further includes at least one reactive sub circuit, each including at least one inductor. The first winding of the transformer is divided into a plurality of winding segments. At least a first one of the at least one reactive sub circuit being connected in series with the winding segments of the first winding between two such winding segments, and having at least one of the at least one inductor located inside said inner border.

18 Claims, 5 Drawing Sheets

(51) Int. Cl.
*H03H 7/42* (2006.01)
*H01F 27/28* (2006.01)
*H03H 1/00* (2006.01)

(52) U.S. Cl.
CPC ........ *H03H 7/1775* (2013.01); *H03H 7/1791* (2013.01); *H03H 7/425* (2013.01); *H01F 27/2804* (2013.01); *H01F 27/29* (2013.01); *H03H 7/38* (2013.01); *H03H 7/42* (2013.01); *H03H 7/427* (2013.01); *H03H 2001/0078* (2013.01)

(56) References Cited

U.S. PATENT DOCUMENTS

| | | | |
|---|---|---|---|
| 5,907,236 A | 5/1999 | James | |
| 6,384,581 B1 | 5/2002 | Sen et al. | |
| 6,717,502 B2 * | 4/2004 | Yue | 336/200 |
| 2003/0186667 A1 * | 10/2003 | Wallace | 455/284 |
| 2006/0270377 A1 | 11/2006 | Bhatti et al. | |
| 2006/0273870 A1 | 12/2006 | Yeung et al. | |
| 2010/0026411 A1 | 2/2010 | Liu et al. | |
| 2010/0154517 A1 | 6/2010 | Sammoura | |

OTHER PUBLICATIONS

International Search Report dated Nov. 28, 2012 for International Application No. PCT/SE2012/050729, International Filing Date Jun. 28, 2012 consisting of 5 pages.

Written Opinion of the International Searching Authority dated Nov. 28, 2012 for International Application No. PCT/SE2012/050729, International Filing Date Jun. 28, 2012, consisting of 8 pages.

\* cited by examiner

TRANSFORMER FILTER ARRANGEMENT

TECHNICAL FIELD

The present invention relates to a transformer filter arrangement, which may be integrated in an integrated circuit, for example a transformer filter arrangement for use in a radio receiver circuit or a radio transmitter circuit.

BACKGROUND

Due to the deployment of more and more frequency bands for cellular radio-communications applications, the complexity of radio front-end circuitry to be used in such applications increases. Normally, at least one relatively expensive external (or "off-chip") filter, usually a SAW (Surface Acoustic Wave) filter, has to be used for each frequency band to be received with the cellular radio. Therefore the size and cost of the external front-end components increase when introducing new frequency bands. Striving towards more flexible front-end solutions requires new circuit solutions that can handle strong interferers and prevent harmonic down-conversion without sacrificing any other performance.

It is thus desirable to provide radio front-end circuitry that eliminates the need for at least some of the off-chip filters, e.g. relatively expensive SAW filters, that are normally used in present cellular radio communications circuitry, or that at least relaxes the requirements on such off-chip filters, which in turn facilitates a reduction of manufacturing cost.

US 2009/0195324 A1 discloses an electronic assembly that includes a substrate, a balun transformer formed on the substrate and including a first winding and a second winding and a reaction circuit component formed on the substrate and connected between a center tap of the second winding and ground. The balun transformer and the reaction circuit component jointly form a harmonically suppressed balun transformer having a fundamental frequency, and the reaction circuit component is tuned such that the harmonically suppressed balun transformer resonates at the second harmonic of the fundamental frequency.

SUMMARY

According to a first aspect, there is provided a transformer filter arrangement, which may be suitable for integrated circuit integation. The transformer filter arrangement comprises a transformer having a first winding and a second winding formed by conducting layers of one of a chip and printed circuit board. Winding loops of both the first and the second windings, when considered in a plane of one of the chip and printed circuit board, enclose an area of the one of the chip and printed circuit board. The transformer filter arrangement comprises at least one reactive sub circuit, each comprising at least one inductor. The first winding of the transformer is divided into a plurality of winding segments. At least a first one of the at least one reactive sub circuit, being connected in series with the winding segments of the first winding between two such winding segments, and having at least one of the at least one inductor, possibly each inductor of the at least the first one of the at least one reactive sub circuit, located inside said area. The planar transformer and the at least one reactive sub circuit are tuned such that the transformer filter arrangement is configured to pass signals at a fundamental frequency and to suppress signals at least at one interfering frequency.

Some embodiments are such that, each of the at least one reactive sub circuit may be connected in series with the winding segments of the first winding between two such winding segments, and may have at least one of the at least one inductor located inside said area.

According to some embodiments, also the second winding of the transformer may be divided into a plurality of winding segments. At least a second one of the at least one reactive sub circuit may be connected in series with the winding segments of the second winding between two such winding segments, and have at least one of the at least one inductor, possibly each inductor of the at least the second one of the at least one reactive sub circuit, located inside said area.

Some embodiments are such that, each of the at least one reactive sub circuit may be one of connected in series with the winding segments of the first winding between two such winding segments and connected in series with the winding segments of the second winding between two such winding segments, and have at least one of the at least one inductor located inside said area.

In some embodiments, each inductor of each reactive sub circuit is located inside said area.

Said at least one interfering frequency may include at least one harmonic of the fundamental frequency. Said at least one harmonic may include at least one odd order harmonic. Said at least one odd order harmonic may include the third harmonic.

The transformer filter arrangement may have a notch-filter characteristic with notches at the at least one harmonic frequency.

The transformer filter arrangement may further comprise at least one additional filtering circuit connected to at least one terminal of at least one of the first and the second windings.

The transformer filter arrangement may be a balun arrangement. The transformer may be a balun transformer.

According to a second aspect, there is provided an integrated circuit comprising the transformer filter arrangement according to the first aspect.

According to a third aspect, there is provided a radio receiver circuit comprising the transformer filter arrangement according to the first aspect.

According to a fourth aspect, there is provided a radio transmitter circuit comprising the transformer filter arrangement according to the first aspect.

According to a fifth aspect, there is provided a radio communication apparatus comprising the integrated circuit according to the second aspect, the radio receiver circuit according to the third aspect, and/or the radio transmitter circuit according to the fourth aspect. The radio communication apparatus may e.g. be, but is not limited to, a wireless data modem, a mobile telephone, or a radio base station.

Further embodiments are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
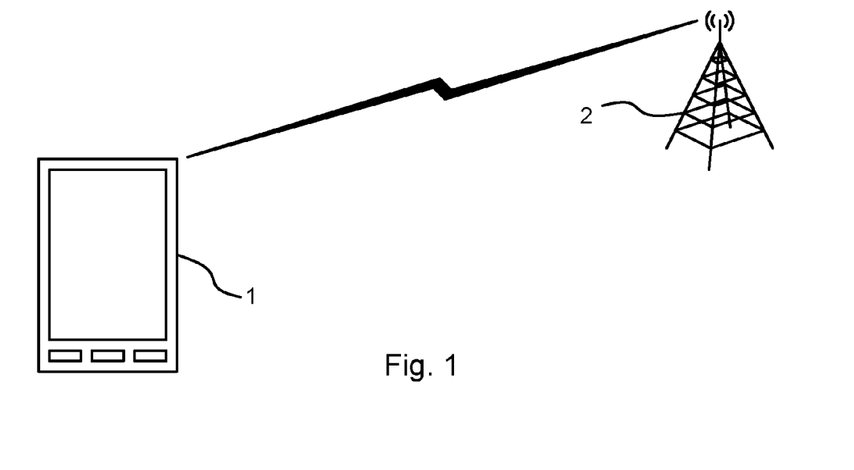
FIG. 1 schematically illustrates a mobile terminal in communication with a radio base station.

FIG. 1 illustrates schematically an environment in which embodiments of the present invention may be employed. In FIG. 1, a mobile terminal 1, illustrated in FIG. 1 as a mobile, or cellular, telephone 1, is in wireless communication with a radio base station 2, e.g. in a cellular communication network. The mobile telephone 1 and the radio base station 2 are nonlimiting examples of what is referred to below generically with the term radio communication apparatus. Another nonlimiting example of such a radio communication apparatus is a wireless data modem, e.g. a wireless data modem to be used in a cellular communication network. Embodiments of the present invention may also be employed in radio communication apparatuses for operation in other types of communication networks, such as but not limited to wireless local area networks (WLANs) and personal area networks (PANs).

Such radio communication apparatuses may comprise one or more radio receiver circuits and/or one or more radio transmitter circuits. Examples of such radio receiver and transmitter circuits are briefly described below with reference to FIG. 2 and FIG. 3, respectively.

Figure 2:
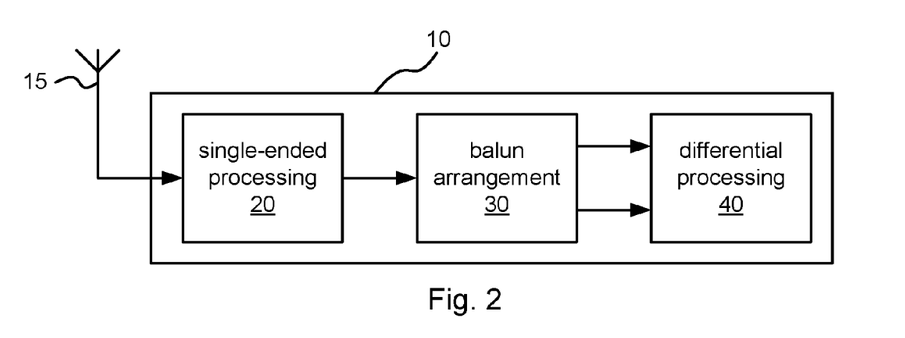
FIG. 2 is a simplified block diagram of a radio receiver circuit.

FIG. 2 is a simplified block diagram of a radio receiver circuit 10 according to an embodiment of the present invention. In FIG. 2, the radio receiver circuit 10 is connected to an antenna 15 for receiving electromagnetic radio frequency (RF) signals. Although a single antenna 15 is shown in FIG. 2, multiple antennas may well be used in other embodiments. In the embodiment illustrated in FIG. 2, the radio receiver circuit comprises single-ended processing circuitry 20 for operative connection to the antenna 15. The single-ended processing circuitry 20 is adapted to perform single-ended (analog) signal processing on a single ended signal from the antenna 15. Normally, it is beneficial e.g. in terms of suppression of noise and even-order distortion, to employ differential signal processing in the analog domain. To enable the use of differential signal processing, the radio receiver circuit 10 comprises a balun (balanced/unbalanced) arrangement 30 operatively connected to the circuitry 20 and adapted to convert a single-ended, or unbalanced, output signal of the single-ended processing circuitry 20 to a differential, or balanced, signal representation. The radio receiver circuit 10 further comprises differential processing circuitry 40 operatively connected to the balun arrangement 30. The differential processing circuitry 40 is adapted to perform differential (analog) signal processing on the differential output signal from the balun arrangement 30. The single-ended processing circuitry 20 and the differential processing circuitry 40 may comprise circuitry such as amplifiers, e.g. one or more variable gain amplifiers (VGAs) and/or one or more low noise amplifiers (LNAs), filters, buffers, mixers etc. that are normally used in radio receiver circuits. The design of such circuitry per se is well known in the art and therefore not further described herein. The radio receiver circuit 10 may further comprise one or more analog-to-digital converters (ADCs, not shown in FIG. 2) for converting analog signals in the radio receiver circuit 10 to digital signals. Furthermore, the radio receiver circuit 10 may also comprise digital signal processing (DSP) circuitry (not shown in FIG. 2), such as a digital baseband processor or the like, for processing of said digital signals. The design of such ADCs and/or DSP circuitry, as well as their inclusion in radio receiver circuits, per se are well known in the art and therefore not further described herein. The single-ended processing circuitry 20, the balun arrangement 30, and the differential processing circuitry 40 may be advantageously integrated on the same integrated circuit chip.

Figure 3:
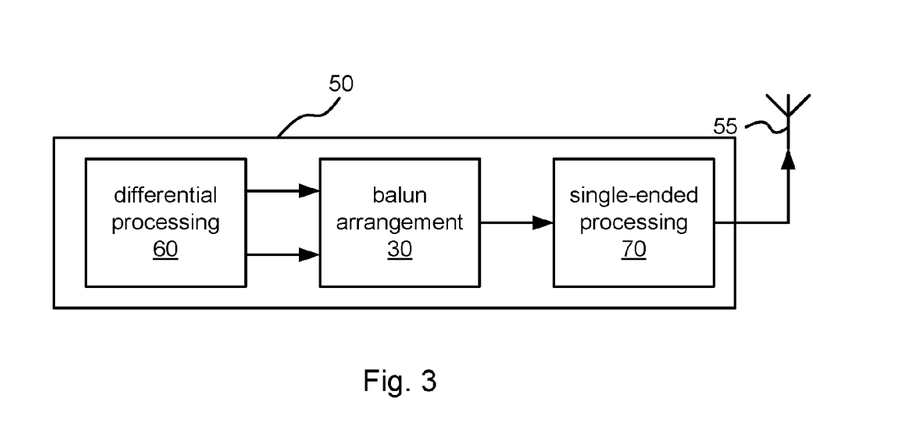
FIG. 3 is a simplified block diagram of a radio transmitter circuit.

FIG. 3 is a simplified block diagram of a radio transmitter circuit 50 according to an embodiment of the present invention. In FIG. 3, the radio transmitter circuit 50 is connected to an antenna 55 for transmitting electromagnetic RF signals. Although a single antenna 55 is shown in FIG. 3, multiple antennas may well be used in other embodiments. In the embodiment illustrated in FIG. 3, the radio transmitter circuit 50 comprises differential processing circuitry 60 adapted to perform differential (analog) signal processing on signals representing data to be transmitted by the radio transmitter circuit 50. Furthermore, in the embodiment illustrated in FIG. 3, the radio transmitter circuit 50 comprises single-ended processing circuitry 70 for operative connection to the antenna 55. The single-ended processing circuitry 70 is adapted to perform single-ended (analog) signal processing on signals representing data to be transmitted by the radio transmitter circuit 50 via the antenna 55. Moreover, according to the embodiment illustrated in FIG. 3, the radio transmitter circuit 50 comprises a balun arrangement 30 operatively connected between the differential processing circuitry 60 and the single-ended processing circuitry 70. The balun arrangement 30 is arranged to convert a differential, or balanced, output signal of the differential processing circuitry 60 to a single-ended, or unbalanced, representation to be input to the single-ended processing circuitry 70. The use of the same reference number 30 for the balun arrangement in both FIG. 2 and FIG. 3 is not an indicator that a single common balun arrangement is shared between the radio receiver circuit 10 and the radio transmitter circuit 50. Rather, it is an indication that embodiments of the balun arrangement 30 may be employed in radio receiver circuits, such as the radio receiver circuit 10, as well as in radio transmitter circuits, such as the radio transmitter circuit 50. The single-ended processing circuitry 70 and the differential processing circuitry 60 may comprise circuitry such as amplifiers, e.g. one or more VGAs and/or one or more power amplifiers (PAs), filters, buffers, mixers etc. that are normally used in radio transmitter circuits. The design of such circuitry per se is well known in the art and therefore not further described herein. Furthermore, the radio transmitter circuit 50 may also comprise DSP circuitry (not shown in FIG. 3), such as a digital baseband processor or the like, for processing and generating digital signals representing data to be transmitted by the radio transmitter circuit 50. The radio transmitter circuit 50 may further comprise one or more digital-to-analog converters (DACs, not shown in FIG. 3) for converting such digital signals to analog signals to be processed by the differential processing circuitry 60 and the single-ended signal processing circuitry 70. The design of such DACs and/or DSP circuitry, as well as their inclusion in radio transmitter circuits, per se are well known in the art and therefore not further described herein. The differential processing circuitry 60, the balun arrangement 30, and the single-ended processing circuitry 70 may be advantageously integrated on the same integrated circuit chip.

The inventors have realized that filtering to some extent can be advantageously merged with, or included in, the balun arrangement 30, e.g. as is further elucidated in the context of embodiments. Thereby, the requirements on off-chip filters may be reduced, and in some embodiments, the need for one or more such off-chip filters, such as a SAW filter, may even be eliminated. As is further elucidated below, embodiments of the present invention may provide for filtering at a relatively small circuit area overhead compared with a "normal" balun arrangement (without such filtering). In many case, such a "normal" balun arrangement would be present anyway in a radio receiver circuit or a radio transmitter circuit. Thus, in some embodiments, such filtering may be introduced in the radio receiver circuit 10 or radio transmitter circuit 50 at a relatively small circuit area overhead.

The balun arrangement 30 considered in embodiments of the present invention is of the type comprising a planar transformer with a primary and a secondary winding that are electromagnetically coupled to each other. Here, a planar transformer can be considered to be implemented by interleaved or stacked topology on a chip or printed circuit board, where the windings in interleaved topology are placed in the same conducting layer with vias interconnecting the winding parts to close the winding loops, and the windings in the stacked topology are placed in adjacent conducting layers covering substantially the same chip or substrate area. Each winding has a terminal at each end. On the differential, or balanced, side of a planar transformer used in such a balun arrangement, both terminals of the corresponding winding are used for signal input or output, as the case may be. On the single-ended, or unbalanced, side of the planar transformer, only one of the terminals of the corresponding winding is used for signal output/input, whereas the other terminal is connected to a reference voltage, such as ground or signal ground. The structures used in various embodiments can be used in other planar transformer arrangements than balun arrangements as well, such as a fully differential transformer arrangement where both terminals of both windings are used for signal input/output, or a fully single-ended transformer arrangement where only one terminal per winding is used for signal input/output, whereas the other terminal of each winding is connected to a reference voltage, such as ground or signal ground. Therefore, in order to accommodate such other transformer arrangements as well, the more generic term transformer filter arrangement 30 is used below instead of balun arrangement 30 (which is a special case of a transformer filter arrangement 30). Embodiments of the transformer filter arrangement 30 described herein are suitable for integrated circuit integration, i.e. are suitable for integration on an integrated circuit chip, which facilitates miniaturization. The transformer filter arrangement may e.g. either be implemented on the same chip as other radio transmitter and/or receiver components, or be implemented on a separate piece of substrate from such other radio transmitter and/or receiver components that may be included in the same integrated circuit package as the chip (or possibly chips) comprising such other radio transmitter and/or receiver components. In some embodiments, the transformer filter arrangement may also be implemented off chip, e.g. utilizing the conducting layers of a printed circuit board or the like.

Figure 4:
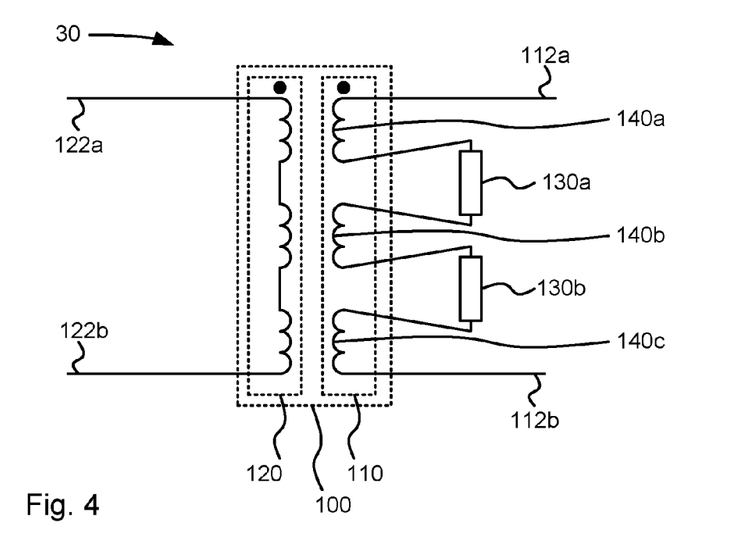
FIG. 4 is a schematic circuit diagram of a transformer filter arrangement according to an embodiment of the present invention.

FIG. 4 is a schematic circuit diagram of the transformer filter arrangement 30 according to an embodiment of the present invention. According to the embodiment, the transformer filter arrangement 30 comprises a planar transformer 100 having a first winding 110 and a second winding 120. In the special case of a balun arrangement, the planar transformer 100 would be a balun transformer 100. In some embodiments, the first winding 110 is a primary winding of the planar transformer 100 and the second winding 120 is a secondary winding of the planar transformer 100. In other embodiments, it is the other way around, i.e. the first winding 110 is a secondary winding of the planar transformer 100 and the second winding 120 is a primary winding of the planar transformer 100. Each of the first winding 110 and the second winding 120 has one or more winding turns. The first winding 110 has (input/output) terminals 112*a* and 112*b* at its ends. Similarly, the second winding 120 has (input/output) terminals 122*a* and 122*b* at its ends. Furthermore, the transformer filter arrangement 30 comprises one or more reactive sub circuits 130*a-b*, each comprising one or more inductors. In FIG. 4, there are two such reactive sub circuits 130*a-b*, but any number of reactive sub circuits may be used in other embodiments. As illustrated in FIG. 4, the first winding 110 of the planar transformer 100 is divided into a plurality of winding segments 140*a-c*. Generally speaking, at least a first one of the one or more reactive sub circuits 130*a-b* is connected in series with the winding segments 140*a-c* of the first winding 110 between two such winding segments 140*a-c*. In the particular embodiment illustrated in FIG. 4, this holds for both of the two reactive sub circuits 130*a-b*. However, in other embodiments, one or more of the plurality of reactive sub circuits may be connected in other ways as well, as is further described below, e.g. with reference to FIG. 11. According to embodiments of the present invention, the planar transformer 100 and the one or more reactive sub circuits 130*a-b* are tuned such that the transformer filter arrangement 30 is configured to pass signals at a fundamental frequency and to suppress signals at one or more interfering frequencies. Thereby, the desired filtering action may be accomplished. The term "tuned" in this context includes "static" tuning, i.e. where circuit parameters such as capacitances and inductances are determined and fixated during the design and manufacturing process, as well as "dynamic" tuning where one or more such circuit parameters may be varied during operation; for example, a capacitor with variable capacitance may be implemented using a varactor diode or by using a switched capacitor array where a number of capacitors can be selectively connected in parallel to allow varying the capacitance.

For example, in a radio receiver circuit, so called harmonic down conversion, i.e. that unwanted signal content is down converted by harmonics of a local oscillator (LO) signal into the same band as wanted signal content is down converted to by the fundamental tone of the LO signal, and thereby interferes with said wanted signal content, may pose a problem. The one or more interfering frequencies, for which the transformer filter arrangement 30 is configured to suppress signals, may therefore be or include one or more harmonics of said fundamental frequency, for which the transformer filter arrangement 30 is adapted to pass signals. Thereby, the problems with harmonic down conversion may be reduced. In some embodiments, the transformer filter arrangement may have a notch-filter characteristic with notches at the one or more harmonic frequencies. In case the down conversion mixer used operates on differential signals (e.g. with reference to FIG. 2, if the down conversion mixer is included in the differential processing circuitry 40), it is normally of particular relevance to suppress signals at odd order harmonics of the fundamental frequency, since these, in contrast to signals at the even order harmonics of the fundamental frequency, are not inherently suppressed by the use of differential signal processing. Therefore, in some embodiments, said one or more harmonics of the fundamental frequency may be or include one or more odd order harmonics. Normally, of the odd order harmonics, the third harmonic (for which the frequency is three times the fundamental frequency) may be the most harmful one. For example, the third harmonic of an LO signal is normally the one of the odd order harmonics that has the highest amplitude (consider e.g. a square-wave LO signal). Therefore, in some embodiments, the one or more odd order harmonics included in said one or more harmonics of the fundamental frequency may be or include the third harmonic.

FIGS. 5-8 show schematic circuit diagrams of examples of embodiments of reactive sub circuits 130 that may e.g. be used as the one or more reactive sub circuits 130a-b mentioned above with reference to FIG. 4. The dotted lines in FIGS. 5-8 indicate where the reactive sub circuit 130 is to be connected to neighboring winding segments 140a-c of the first winding 110.

Figure 5:
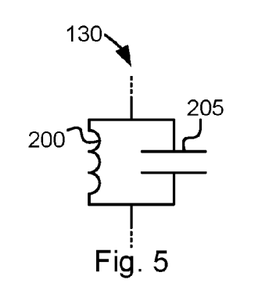
FIGS. 5-8 are schematic circuit diagrams of reactive sub circuits according to various embodiments of the present invention.
Figure 6:
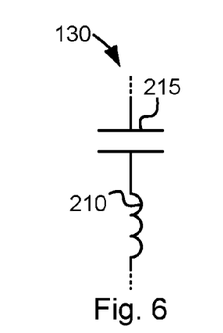
Figure 7:
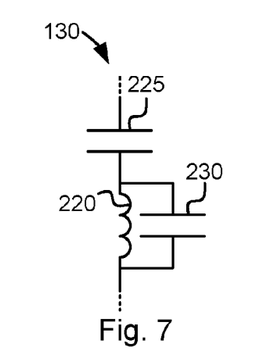
Figure 8:
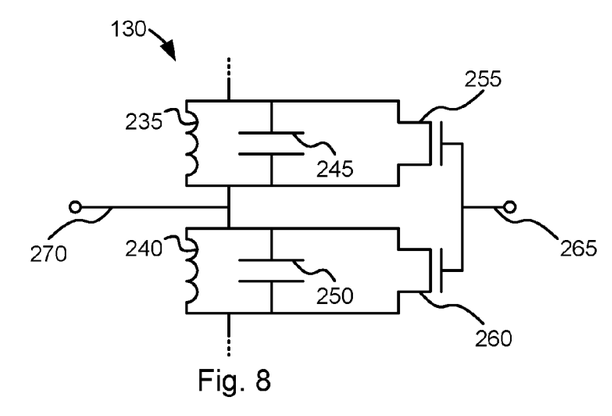

In FIG. 5, the reactive sub circuit 130 is a parallel connection of an inductor 200 and a capacitor 205. In FIG. 6, the reactive sub circuit 130 is a series connection of an inductor 210 and a capacitor 215. In FIG. 7, the reactive sub circuit 130 is a series connection of a capacitor 225 and a parallel connection of an inductor 220 and a capacitor 230. In FIG. 8, the reactive sub circuit 130 comprises a series connection of:
 a first parallel connection of an inductor 235 and a capacitor 245; and
 a second parallel connection of an inductor 240 and a capacitor 250.

In addition, the reactive sub circuit 130 of FIG. 8 comprises by-pass switches 255 and 260, illustrated in FIG. 8 as implemented with MOS transistors that are controllable from a control terminal 265. Thereby, it is possible to selectively by pass (or effectively disable) the reactive sub circuit 130. This in turn enables a variable transfer characteristic of the transformer filter arrangement 30, such that the transformer filter arrangement can be configurable for use in different applications. The reactive sub circuit 130 as illustrated in FIG. 8 further includes a center tap 270 for applying a bias voltage. For example, if the reactive sub circuit 130 of FIG. 8 is placed on the differential (or balanced) side of a balun arrangement and in the center of the corresponding winding, said bias voltage may be a common-mode bias voltage.

The reactive sub circuit of FIG. 5 may be used to accomplish a notch filter characteristic of the transformer filter arrangement 30. The parallel connection of the inductor 200 and the capacitor 205 may be tuned to resonate at an interfering frequency, thereby providing a notch at that interfering frequency.

The reactive sub circuit 130 of FIG. 6 may be used to accomplish a band pass characteristic of the transformer filter arrangement 30. The series connection of the inductor 210 and the capacitor 215 may be tuned to resonate at the fundamental frequency, thereby providing a pass band around the fundamental frequency, where signals at frequencies inside this pass band are allowed to pass, whereas signals at frequencies outside this pass band are suppressed.

The reactive sub circuit of FIG. 7 can be seen as a combination of the reactive sub circuits 130 of FIGS. 5 and 6. The series connection of the inductor 220 and the capacitor 225 may be tuned to resonate at the fundamental frequency, thereby providing a pass band around the fundamental frequency, where signals at frequencies inside this pass band are allowed to pass, whereas signals at frequencies outside this pass band are suppressed. The parallel connection of the inductor 220 and the capacitor 230 may be tuned to resonate at an interfering frequency, thereby providing a notch at that interfering frequency to further suppress signals at that particular interfering frequency.

Furthermore, the reactive sub circuit of FIG. 8 may also be used to accomplish a notch filter characteristic of the transformer filter arrangement 30. The parallel connection of the inductor 235 and the capacitor 245 may be tuned to resonate at an interfering frequency, thereby providing a notch at that interfering frequency. In addition, the parallel connection of the inductor 240 and the capacitor 250 may be tuned to resonate an interfering frequency (which may be the same as for the parallel connection of the inductor 235 and the capacitor 245, or may be another interfering frequency), thereby providing a notch at that interfering frequency.

The connection of the one or more reactive sub circuits 130a-b between winding segments 140a-c of the first winding 110 facilitates an area saving layout of the transformer filter arrangement 30, where one or more of the inductors of the one or more reactive sub circuits 130a-b may be geometrically placed "inside" the first and second windings 110, 120. This is illustrated with an example embodiment in FIGS. 9-10.

Figure 9:
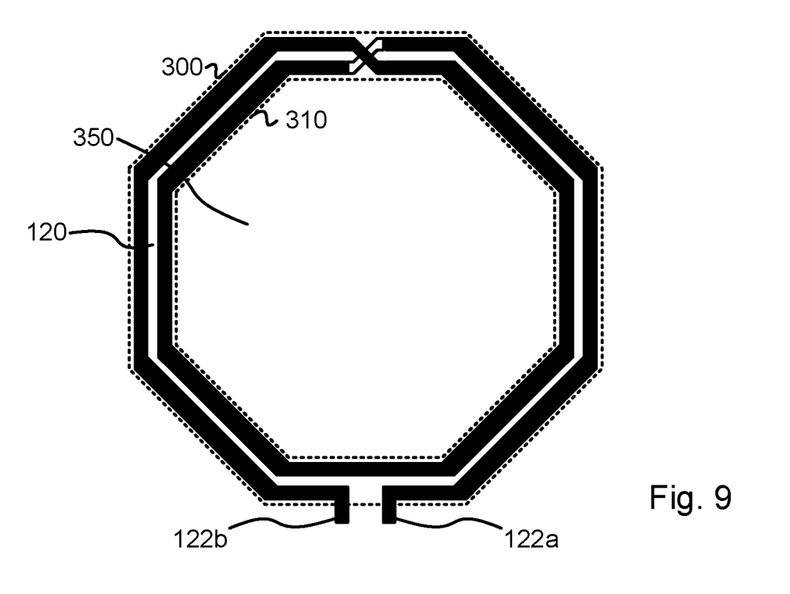
FIGS. 9-10 show circuit layouts of parts of a transformer filter arrangement according to embodiments of the present invention.

FIG. 9 illustrates the layout of the second winding 120 according to this example embodiment. The second winding is formed by conducting layers of a chip or printed circuit board, as will be further demonstrated below. The second winding is located between an outer border 300 and an inner border 310, which is inside the outer border 300, wherein the inner border 310 defines an area 350. That is, the winding loops of the second winding 120, considered in a plane of the chip or printed circuit board, encloses the area 350. The inner and outer borders 300 and 310 are indicated in FIG. 9 with dotted lines. The terminals 122a-b of the second winding 120 are indicated at the bottom of FIG. 9. At the top, the second winding 120 crosses its own path. In the crossing, a solid (or "filled") and an open (or "unfilled") path pattern is used to indicate that different metal layer of the integrated circuit chip are used in this crossing to avoid short circuiting. This convention is used throughout the layout figures.

Figure 10:
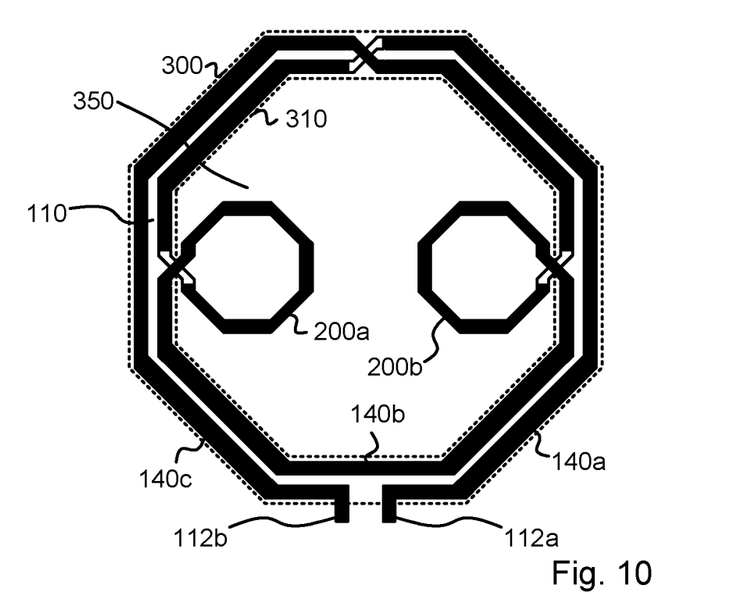

FIG. 10 illustrates the layout of the first winding 110 together with two inductors 200a and 200b of reactive sub circuits. For example, the layout examples in FIGS. 9-10 may correspond to the schematic circuit diagram of the transformer filter arrangement 30 shown in FIG. 4 having two reactive sub circuits 130a-b implemented as the reactive sub circuit 130 in FIG. 5. In that case, the inductor 200a belongs to the reactive sub circuit 130a and corresponds to the inductor 200 of FIG. 5. Similarly, the inductor 200b belongs to the reactive sub circuit 130b and corresponds to the inductor 200 of FIG. 5. The winding segments 140a-c are indicated in FIG. 10 as well. The terminals 112a-b of the first winding 110 are indicated at the bottom of FIG. 10. The first winding is formed by conducting layers of a chip or printed circuit board. As can bee seen in FIG. 10, also the first winding is located between the same outer border 300 and the same inner border 310 as the second winding 120. That is, also the winding loops of the first winding 110, considered in a plane of the chip or printed circuit board, encloses the area 350. In the example embodiments illustrated in FIGS. 9-10, the first winding 110 is implemented in metal layer(s) over or under the metal layer(s) in which the second winding 120 is implemented. Note thus that the solid and open path patterns in FIG. 10 do not correspond to the same metal layers as the solid and open path patterns, respectively, in FIG. 9 (if that had been the case, there would have been a short circuit between the first and the second winding 110, 120). In other embodiments, however, the first and the second winding 110, 120 may in fact be implemented in the same metal layer(s) by geometrically interleaving the winding turns of the first and the second winding 110, 120 (and using different metal layers where the windings cross).

In the layout examples provided herein, the terminals 112a-b of the first winding 110 and the terminals 122a-b of the second winding 120 are located in the same place (but in different layers). It should be noted that this is only an example. In other embodiments, the terminals may be placed anywhere. For example, the terminal placement may be based on overall floor plan considerations of the circuit in which the transformer filter arrangement 30 is used, e.g. such that each terminal is located at the same side of the planar transformer 100 as the component it is to be connected to. The layouts of the first and second windings illustrated herein may for example be rotated with respect to each other, such as but not limited to with an integer multiple of 90°.

As illustrated in FIG. 10, the inductors 200a and 200b of the reactive sub circuits 130a-b can be located inside the inner border 310, i.e. in the area 350, thereby saving valuable circuit area; the combination of the planar transformer 100 together with the inductors 200a and 200b of the reactive sub circuits 130a-b occupies the same circuit area as a "normal" planar transformer (i.e. a planar transformer where both windings are laid out as in FIG. 9), and no additional circuit area outside the outer border 300 is consumed by the inductors 200a and 200b of the reactive sub circuits 130a-b.

More generally speaking, an area saving layout may be obtained when, for at least a first one of the one or more reactive sub circuits, at least one of the one or more inductors of that reactive sub circuit is located inside the inner border 310, i.e. in the area 350. The more of the inductors that are located inside the inner border 310, the better is the area saving. Thus according to some embodiments, each inductor of said at least first one of the one or more reactive sub circuits is located inside the inner border 310.

In some embodiments, such as the one illustrated in FIG. 4, all of the reactive sub circuits 130a-b are merged with the first winding. That is, these embodiments are such that, for each of the one or more reactive sub circuits (e.g. 130a-b), the reactive sub circuit is connected in series with the winding segments (e.g. 140a-c) of the first winding 110 between two such winding segments. By, for each one of the one or more reactive sub circuits, placing, or locating, at least one of the one or more inductors of the reactive sub circuit inside said inner border 310, i.e. in the area 350, an area saving layout can be obtained.

Figure 11:
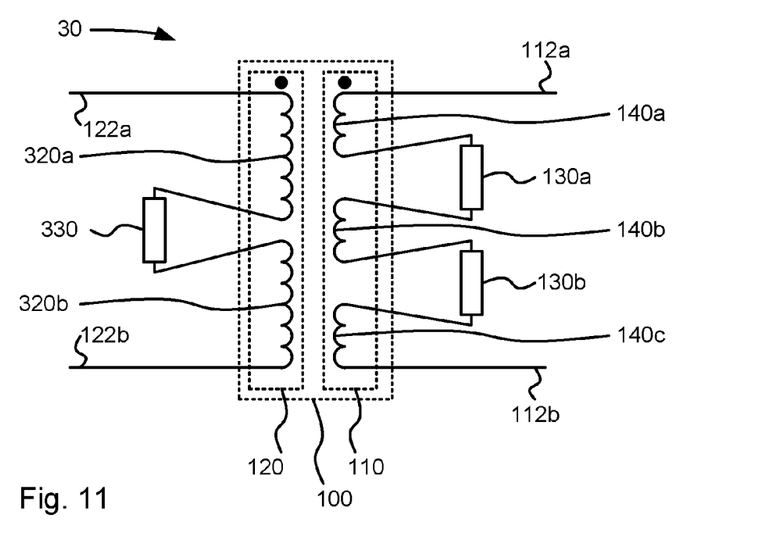
FIG. 11 is a schematic circuit diagram of a transformer filter arrangement according to an embodiment of the present invention.
Figure 12:
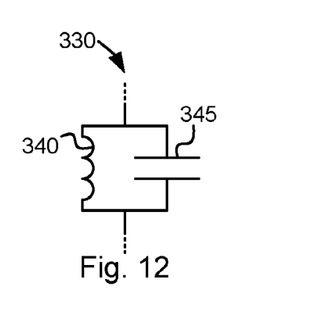
FIG. 12 is a schematic circuit diagram of a reactive sub circuit according to an embodiment of the present invention.
Figure 13:
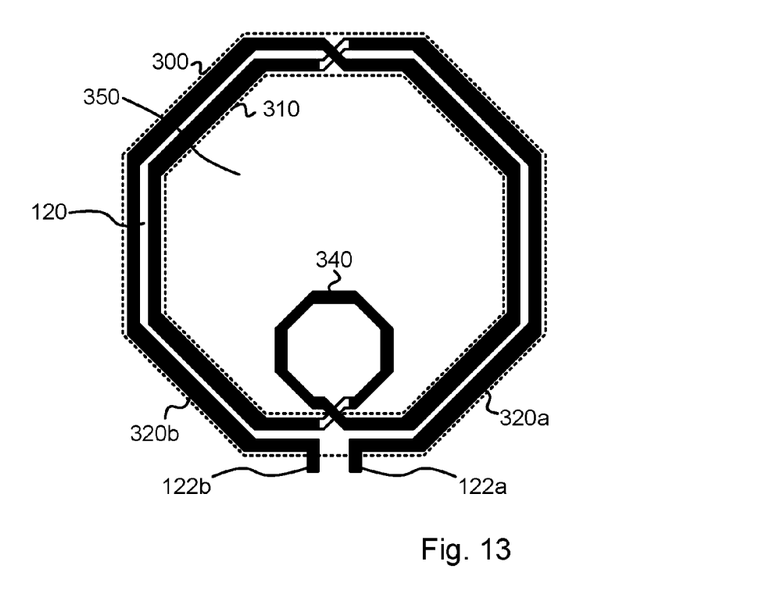
FIG. 13 shows a circuit layout of a part of a transformer filter arrangement according to an embodiment of the present invention.

According to some embodiments, also the second winding 120 of the planar transformer may be divided into winding segments having reactive sub circuits connected in series between them. This is illustrated in FIG. 11, where the second winding 120 is divided into two winding segments 320a-b. A reactive sub circuit 330 is connected in series with the winding segments 320a-b between the winding segments 320a-b. Although a single reactive sub circuit 330 is merged with the second winding 120 in FIG. 11, generally speaking, any number of reactive sub circuits may be merged with the second winding 120 in various embodiments. Thus, some embodiments are such that, for at least a second one of the one or more reactive sub circuits (e.g. 330), the reactive sub circuit is connected in series with the winding segments (e.g. 320a-b) of the second winding 120 between two such winding segments. Similarly to what is described above, an area saving layout may be obtained by placing, or locating, at least one of the one or more inductors of said at least second one of the reactive sub circuits inside the inner border 310. This is further described and elucidated in the context of FIGS. 12-13, illustrating a more detailed version of the embodiment illustrated in FIG. 11. Similarly to what is described above, the more of the inductors that are located inside the inner border 310, i.e. in the area 350, the better is the area saving. Thus according to some embodiments, each inductor of said at least second one of the one or more reactive sub circuits is located inside the inner border 310, i.e. in the area 350.

The reactive sub circuits (e.g. 330) connected in series with the winding segments (e.g. 320a-b) of the second winding 120 may e.g. be implemented as any of the embodiments of the reactive sub circuit 130 illustrated in FIGS. 5-8, but is not limited thereto. FIG. 12 shows a schematic circuit diagram of the reactive sub circuit 330 (corresponding to the embodiment of the reactive sub circuit 130 illustrated in FIG. 5) according to a specific embodiment. According to the embodiment illustrated in FIG. 12, the reactive sub circuit 330 comprises an inductor 340 connected in parallel with a capacitor 345.

FIG. 13 illustrates the layout of the second winding 120 together with the inductor 340, which is located inside the inner border 310, i.e. in the area 350. The first winding 110 and the inductors 200a-b of the reactive sub circuits 130a-b may e.g. be laid out as in the embodiment illustrated in FIG. 10.

Combining the discussions above regarding various embodiments, some embodiments of the present invention are such that, for each of the one or more reactive sub circuits (e.g. 130a-b, 330), the reactive sub circuit is either connected in series with the winding segments (e.g. 140a-c) of the first winding 110 between two such winding segments, or connected in series with the winding segments (e.g. 320a-b) of the second winding 120 between two such winding segments. Furthermore, some of these embodiments are such that, for each of the one or more reactive sub circuits (e.g. 130a-b, 330), at least one of the one or more inductors (e.g. 200a-b, 340) of the reactive sub circuit is located inside said inner border, whereby an area saving layout is obtained.

Provided that there is enough area available inside the inner border 310, the most area saving layout is obtained if all inductors of the reactive sub circuits are located inside the inner border. Thus, according to some embodiments, each inductor of each reactive sub circuit is located inside said inner border 310, i.e. in the area 350.

Figure 14:
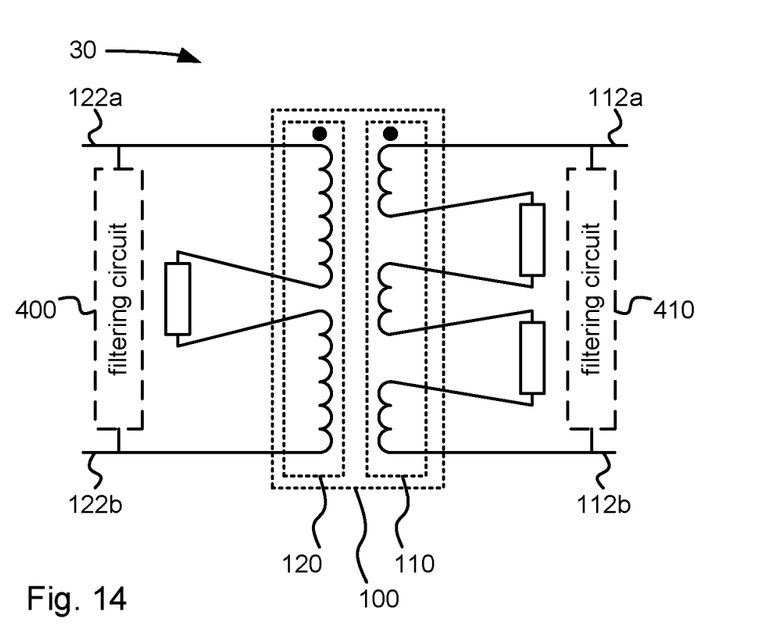
FIG. 14 is a schematic circuit diagram of a transformer filter arrangement according to an embodiment of the present invention.

The filtering performance of the transformer filter arrangement 30 may be further improved by connecting active circuits such as amplifiers, isolation buffers or frequency converters, or passive circuits for further reactive filtering to one or both of the terminals 112*a-b* of the first winding 110 and/or one or both of the terminals 122*a-b* of the second winding. This filter chain is illustrated in FIG. 14, showing an optional filtering circuit 400 connected between the terminals 122*a* and 122*b* of the second winding 120, and an optional filtering circuit 410 connected between the terminals 112*a* and 112*b* of the first winding 110. The filtering circuits 400 and 410 can be either active or passive. In general, the filtering circuits 400 and 410 can be any bandwidth limited physical circuits. In some cases, the active amplifiers, isolation buffers or frequency converters with specific frequency response are used which also reduce the correlation among the filters in the filter chain.

The transformer filter arrangement 30 shown in FIG. 14 can be cascaded together as a multistage structure to perform a enhanced frequency filter operation.

Above, the placement of inductors inside said inner border for saving circuit area is described. The placement of capacitors of the reactive sub circuits normally has less impact on the overall circuit area, since the capacitors normally have smaller area than the inductors. Thus, normally it is the placement of inductors that is most important for the circuit-area considerations. Thus, placing a capacitor outside the planar transformer 100 would normally have less impact on the circuit area than placing an inductor outside the planar transformer 100, and in some embodiments, the capacitors of the reactive sub circuits may be placed anywhere on the chip. However, placing also one, some, or all of the capacitors of one, some, or all of the reactive sub circuits inside the inner border 310 would also to some extent be beneficial for saving circuit area. Thus, according to some embodiments, one, some, or all of the capacitors of one, some, or all of the reactive sub circuits are located inside the inner border 310.

Figure 15:
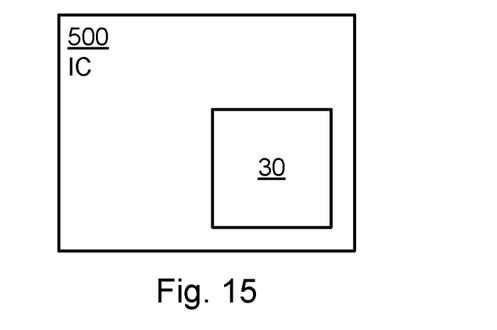
FIG. 15 is a simplified block diagram of an integrated circuit comprising a transformer filter arrangement according to an embodiment of the present invention.

As indicated above, the transformer filter arrangement may in some embodiments be advantageously integrated in an integrated circuit. This is schematically illustrated in FIG. 15, showing a simplified block diagram of an embodiment of an integrated circuit 500 comprising the transformer filter arrangement 30. For example, the integrated circuit 500 may comprise the radio receiver circuit 10 (or parts thereof) and/or the radio transmitter circuit 50 (or parts thereof). Conversely, the integrated circuit 500 may, in some embodiments, be comprised in the radio receiver circuit 10, the radio transmitter circuit 50, and/or a radio communication apparatus such as the mobile telephone 1 or the radio base station 2 (FIG. 1).

To illustrate some benefits of embodiments of the present invention, a comparison with a circuit presented in US 2009/0195324 A1 is presented below. The circuit in US 2009/0195324 A1 comprises a balun transformer, which has a series connection of a capacitor and an inductor connected between a center tap of the balanced-side winding of the balun transformer and ground. Notably, the capacitor and inductor are located outside the balun transformer, thereby taking up additional circuit area. In contrast thereto, in embodiments of the present invention, inductors of reactive sub circuits are located inside the inner border 310 of the transformer windings 110, 120, whereby valuable circuit area is saved. In US 2009/0195324 A1, the capacitor and inductor are set to resonate at a resonance frequency equal to a second harmonic frequency. Further analysis of the circuit in US 2009/0195324 A1 reveals that, what this circuit actually does is to suppress common-mode variations at said resonance frequency, but does not perform any "actual" filtering, i.e. it does not remove or suppress any content of the differential signal at the resonance frequency; a balanced input signal, with a frequency equal to said resonance frequency, input on the balanced-side winding of the balun transformer in the circuit of US 2009/0195324 A1 would pass through that circuit unaffected, i.e. in the same way as if said capacitor and inductor had not been present. That can e.g. be realized by considering the fact that for a balanced input signal, without any common-mode variations, the center tap of the balanced-side winding of the balun transformer is a virtual signal ground node (without any voltage variations), so said capacitor and inductor cannot have any influence in the absence of common-mode variations. In contrast thereto, embodiments of the present invention, where reactive sub circuits are connected in series with the winding segments, provides for actual filtering. In differential signals, even-order distortion (such as the second harmonic) often appears as common-mode signals, whereas odd-order distortion often appears as differential signals. In such cases, the circuit in US 2009/0195324 A1 can be useful for suppressing even-order distortion, but not for suppressing odd-order distortion, which would require actual filtering. In contrast thereto, embodiments of the present invention, which performs actual filtering, are capable of suppressing such odd-order distortion appearing as differential signals. It can be noted that, in fact, embodiments of the present invention may be combined with the circuit disclosed in US 2009/0195324 A1 to achieve both filtering and common-mode stabilization.

The present invention has been described above with reference to specific embodiments. However, other embodiments than the above described are possible within the scope of the invention. The different features of the embodiments may be combined in other combinations than those described. The scope of the invention is only limited by the appended patent claims.

The invention claimed is:

1. A radio communication apparatus comprising at least one transformer filter arrangement, each transformer filter arrangement including:
    a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
    at least one reactive sub circuit, each comprising at least one inductor;
    the first winding of the transformer is divided into a plurality of winding segments;
    each of the at least one reactive sub circuit:
    being connected in series with the winding segments of the first winding between two such winding segments; and
    having at least one of the at least one inductor located in said area; and the transformer and the at least one reactive sub circuit being tuned such that the transformer filter arrangement is configured to pass signals at a fundamental frequency and to suppress signals at least at one interfering frequency.

2. The radio communication apparatus of claim 1, wherein the at least one transformer is part of at least one of an integrated circuit, radio receiver circuit and radio transmitter circuit.

3. The radio communication apparatus of claim 2, wherein the radio communication apparatus is one of a wireless data modem, a mobile telephone and a radio base station.

4. A transformer filter arrangement, comprising:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
at least one reactive sub circuit, each comprising at least one inductor;
the first winding of the transformer is divided into a plurality of winding segments;
at least a first one of the at least one reactive sub circuit:
being connected in series with the winding segments of the first winding between two such winding segments; and
having at least one of the at least one inductor located in said area; and
the transformer and the at least one reactive sub circuit being tuned such that the transformer filter arrangement is configured to pass signals at a fundamental frequency and to suppress signals at least at one interfering frequency; and
the transformer filter arrangement is a balun arrangement and the transformer is a balun transformer.

5. A radio communication apparatus comprising at least one transformer filter arrangement, each transformer filter arrangement including:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
at least one reactive sub circuit including at least a first one reactive sub circuit and at least a second one reactive sub circuit, each comprising at least one inductor;
the first winding of the transformer is divided into a first plurality of winding segments;
the at least the first one of the at least one reactive sub circuit and the at least the second one of the at least one reactive sub circuit:
being connected in series with the winding segments of the first winding between two such winding segments; and
having at least one of the at least one inductor located in said area; and the transformer and the at least one reactive sub circuit being tuned such that the transformer filter arrangement is configured to pass signals at a fundamental frequency and to suppress signals at least at one interfering frequency;
the second winding of the transformer is divided into a second plurality of winding segments;
at least a third one of the at least one reactive sub circuit:
being connected in series with the winding segments of the second winding between two such winding segments; and
having another of the at least one inductor located in said area.

6. A transformer filter arrangement, comprising:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
at least one reactive sub circuit including at least a first one reactive sub circuit and at least a second one reactive sub circuit, each comprising at least one inductor;
the first winding of the transformer is divided into a first plurality of winding segments;
the at least the first one of the at least one reactive sub circuit and the at least the second one of the at least one reactive sub circuit:
being connected in series with the winding segments of the first winding between two such winding segments; and
having at least one of the at least one inductor located in said area; and
the transformer and the at least one reactive sub circuit being tuned such that the transformer filter arrangement is configured to pass signals at a fundamental frequency and to suppress signals at least at one interfering frequency;
the second winding of the transformer is divided into a second plurality of winding segments;
at least a third one of the at least one reactive sub circuit:
being connected in series with the winding segments of the second winding between two such winding segments; and
having another of the at least one inductor located in said area.

7. A radio communication apparatus comprising at least one transformer filter arrangement, each transformer filter arrangement including:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
at least one reactive sub circuit, each comprising at least one inductor;
the first winding of the transformer is divided into a plurality of winding segments;
at least a first one of the at least one reactive sub circuit:
being connected in series with the winding segments of the first winding between two such winding segments; and
having at least one of the at least one inductor located in said area; and
the transformer and the at least one reactive sub circuit being tuned such that the transformer filter arrangement is configured to pass signals at a fundamental frequency and to suppress signals at least at one interfering frequency; and
said at least one interfering frequency includes at least one harmonic of the fundamental frequency.

8. A transformer filter arrangement, comprising:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
   at least one reactive sub circuit, each comprising at least one inductor;
   the first winding of the transformer is divided into a plurality of winding segments;
at least a first one of the at least one reactive sub circuit:
   being connected in series with the winding segments of the first winding between two such winding segments; and
   having at least one of the at least one inductor located in said area; and
   the transformer and the at least one reactive sub circuit being tuned such that the transformer filter arrangement is configured to pass signals at a fundamental frequency and to suppress signals at least at one interfering frequency; and
   said at least one interfering frequency includes at least one harmonic of the fundamental frequency.

9. The transformer filter arrangement of claim 8, wherein the at least one harmonic includes at least one odd order harmonic.

10. The transformer filter arrangement of claim 9, wherein the at least one odd order harmonic includes a third harmonic.

11. The transformer filter arrangement of claim 8, wherein the transformer filter arrangement has a notch-filter characteristic with notches at the at least one harmonic frequency.

12. A radio communication apparatus comprising at least one transformer filter arrangement, each transformer filter arrangement including:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
   at least one reactive sub circuit, each comprising at least one inductor; the first winding of the transformer is divided into a plurality of winding segments;
at least a first one of the at least one reactive sub circuit:
   being connected in series with the winding segments of the first winding between two such winding segments; and
   having at least one of the at least one inductor located in said area; and the transformer and the at least one reactive sub circuit being tuned such that the transformer filter arrangement is configured to pass signals at a fundamental frequency and to suppress signals at least at one interfering frequency; and
the transformer filter arrangement is a balun arrangement and the transformer is a balun transformer.

13. A transformer filter arrangement, comprising:
a transformer having a first winding and a second winding formed by conducting and isolation layers of one of a chip and printed circuit board, winding loops of both the first and the second windings, when considered in a plane of the first winding and the second winding of the transformer, enclose an area of the one of said chip and printed circuit board; and
   at least one reactive sub circuit, each comprising at least one inductor;
   the first winding of the transformer is divided into a first plurality of winding segments;
each of the at least one reactive sub circuit:
   being connected in series with the winding segments of the first winding between two such winding segments; and
   having at least one of the at least one inductor located in said area; and
   the transformer and the at least one reactive sub circuit being tuned such that the transformer filter arrangement is configured to pass signals at a fundamental frequency and to suppress signals at least at one interfering frequency.

14. The transformer filter arrangement of claim 13, wherein the transformer filter arrangement is part of an integrated circuit.

15. The transformer filter arrangement of claim 13, wherein the transformer filter arrangement is part of a radio receiver circuit.

16. The transformer filter arrangement of claim 13, wherein the transformer filter arrangement is part of a radio transmitter circuit.

17. The transformer filter arrangement of claim 1, wherein each inductor of each reactive sub circuit is located in said area.

18. The transformer filter arrangement of claim 13, further comprising at least one additional filtering circuit connected to at least one terminal of at least one of the first and the second winding.

* * * * *